United States Patent [19]

Hayashi et al.

[11] Patent Number: 4,767,189
[45] Date of Patent: Aug. 30, 1988

[54] TERMINAL CONNECTION STRUCTURE FOR A LIQUID CRYSTAL DISPLAY DEVICE

[75] Inventors: Yuzo Hayashi; Yoshihiro Nagura, both of Iwaki, Japan

[73] Assignee: Alps Electric Co., Ltd., Japan

[21] Appl. No.: 902,757

[22] Filed: Sep. 2, 1986

[30] Foreign Application Priority Data

Sep. 6, 1985 [JP] Japan ............... 60-136573[U]

[51] Int. Cl.⁴ .............................................. G02F 1/13
[52] U.S. Cl. ..................................... 350/334; 350/336
[58] Field of Search ............... 350/334, 336; 339/17 E, 339/17 M, 17 L

[56] References Cited

U.S. PATENT DOCUMENTS 4,483,591 11/1984 Baeger ................................. 350/334

FOREIGN PATENT DOCUMENTS 0070843 6/1978 Japan ................................. 350/334
0062029 4/1982 Japan ................................. 350/336
208529 12/1982 Japan ................................. 350/334
0060420 4/1984 Japan ................................. 350/334
0086524 5/1985 Japan ................................. 350/334

Primary Examiner—Stanley D. Miller
Assistant Examiner—Huy Mai
Attorney, Agent, or Firm—Guy W. Shoup; Paul J. Winters; Gerard F. Dunne

[57] ABSTRACT

In a connection structure for a liquid crystal display device between the terminal of a liquid crystal display device and a flexible flat cable, the end of the cover film of the flexible flat cable rides over the end of the substrate of the liquid crystal display device, and the electroconductive pattern of the flexible flat cable is in electrical connection with the terminal of said liquid crystal display device. The electroconductive pattern can be prevented from damaging or disconnection, by which the reliability upon handling or movement can be improved.

2 Claims, 1 Drawing Sheet

TERMINAL CONNECTION STRUCTURE FOR A LIQUID CRYSTAL DISPLAY DEVICE

BACKGROUND OF THE INVENTION

1. Field of the Invention

This invention concerns a connection structure for the terminal of a liquid crystal display device and a flexible flat cable.

2. Description of the Prior Art

As shown in FIG. 2, a liquid crystal display device 1 has a structure in which upper and lower substrates 4, 5 having electrode films 2, 3 formed to the insides thereof respectively are bonded opposed to each other by means of a sealer 6 and liquid crystals 7 are sealed therein. To the end edge of the lower substrate 5, is formed a terminal 8 in electrical conduction with the electrode membranes 2 or 3. While on the other hand, a flexible flat cable 9 has a structure in which an electroconductive pattern 12 is put between a base film 10 and a cover film 11. The flexible flat cable 9 is connected to the terminal 8 of the liquid crystal display device 1 by means of soldering 13 at the electroconductive pattern 12 exposed by removing the cover film 11 at the connection portion of the cable 9. In this case, it has been adapted such that the end of the cover film 11 of the flexible flat cable 9 may not ride over the end of the lower substrate 5 of the liquid crystal display device 11. It is considered that such a structure is adopted for avoiding undesired effects due to the step relative to the cover film 11.

However, in the conventional connection structure as described above, the electroconductive pattern 12, particularly, at the portion illustrated by the line A-A' in the figure may be damaged or disconnected by the angular corner of the lower substrate 5 thereby causing conduction failure during repeated handling or movement of the connected liquid crystal display device.

SUMMARY OF THE INVENTION

It is, accordingly, an object of this invention to overcome the foregoing problems in the prior art and provide a terminal structure for a liquid crystal display device capable of avoiding the damage and disconnection for the electroconductive pattern in the flexible flat cable and improving the reliability upon handling.

The foregoing object can be attained by the terminal connection structure for a liquid crystal display device in accordance with this invention, wherein the end of the cover film of a flexible flat cable rides over the end of the substrate of the liquid crystal display device and the electroconductive pattern of the flexible flat cable is in electrical connection with the terminal of the liquid crystal display device.

Since the electroconductive pattern of the flexible flat cable is kept from direct contact with the angular corner of the substrate end, damage and disconnection in the electroconductive pattern can be prevented.

In this invention, the length of the cover film of the flexible flat cable that rides over the end of the substrate is appropriately about from 0.1 to 0.8 mm, although there is no particular restriction. If the overriding length is too large, the end of the flexible flat cable is liable to be separated from the substrate.

The electroconductive pattern of the flexible flat cable and the terminal of the liquid crystal display device can be connected by means of soldering, electroconductive adhesives, heat welding or the like.

BRIEF DESCRIPTION OF THE ACCOMPANYING DRAWINGS

These and other objects, features, as well as advantageous effect of this invention will be made apparent by reading the descriptions of a preferred embodiment of this invention in conjunction with the appended drawings, wherein FIG. 1 is a cross sectional view showing a preferred embodiment of a terminal connection structure for the liquid crystal display device according to this invention, and FIG. 2 is a cross sectional view showing an embodiment of a terminal connection structure for a conventional liquid crystal display device.

DESCRIPTION OF THE PREFERRED EMBODIMENT

Figure 1:
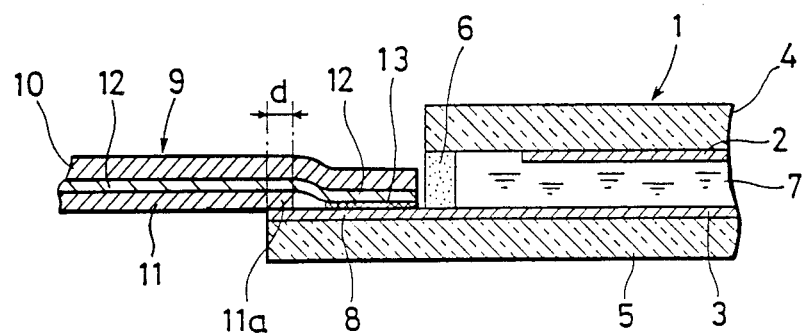
Figure 2:
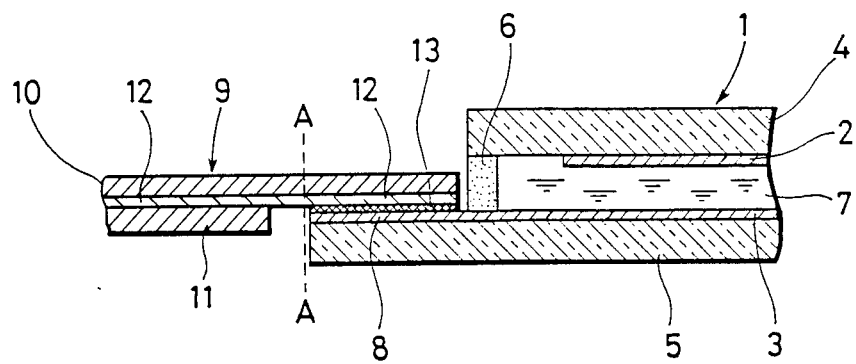

FIG. 1 shows a preferred embodiment of a terminal connection structure for a liquid crystal display device according to this invention. Corresponding portions in FIG. 1 to those in FIG. 2 carry the same reference numerals.

A flexible flat cable 9 is removed with a cover film 11 at a connection portion by which an electroconductive pattern 12 is exposed. In this embodiment, the end 11a of the cover film 11 rides over the end of a lower substrate 5, and the electroconductive pattern 12 and the terminal 8 of the lower substrate 5 are connected at the leading end of the flexible flat cable 9 by means of solder 13. The length d of the end 11a of the cover film 11 riding over the lower substrate 5 is set about 0.2 to 0.3 mm.

In the liquid crystal display device 1 connected with the flexible flat cable 9 in the manner as described above, if the flexible flat cable 9 is jerked by the handling or movement, the electroconductive pattern is not in direct contact with the angular corner of the lower substrate 5 and, accordingly, the electroconductive pattern 12 is neither damaged nor disconnected, thereby enabling to improve the reliability. Further, since the riding over length d of the end 11a of the cover film 11 is short, there is no possibility that the electroconductive pattern 12 is readily separated from the terminal 9.

As has been described above according to this invention, since the flexible flat cable is connected to the liquid crystal display device such that the end of the cover film of the cable rides over the end of the substrate of the device, the electroconductive pattern of the flexible flat cable is not in direct contact with the angular corner of the substrate, whereby the electroconductive pattern can be prevented from damaging or disconnection, thereby enabling to improve the reliability upon handling or movement.

What is claimed is:

1. A connection structure for connecting a liquid crystal display device having a flat terminal surface and an end of a flexible flat cable having an electroconductive layer sandwiched between upper and lower cover films said upper cover film disposed on an upper side to the end of the flexible flat cable, comprising the improvement of said lower cover film disposed on a lower side facing the flat terminal surface having a portion removed from the end of the cable to expose said electroconductive layer on said lower side, an edge of said lower cover film disposed on a lower side facing the flat so as to ride on an edge of said terminal surface by a relatively short length, and the exposed portion of said electroconductive layer being fixed in electrical connection with said terminal surface.

2. The connection structure for connecting the liquid crystal display device as defined in claim 1, wherein said length is set between about 0.1 to 0.8 mm.

* * * * *